United States Patent
Srinivasan et al.

(10) Patent No.: US 8,519,873 B2
(45) Date of Patent: Aug. 27, 2013

(54) CORRECTING FOR NON-LINEARITIES IN A CONTINUOUS-TIME SIGMA-DELTA MODULATOR

(75) Inventors: Venkatesh Srinivasan, Dallas, TX (US);
Vijay B. Rentala, Plano, TX (US);
Victoria W. Limetkai, Dallas, TX (US);
Baher Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 68 days.

(21) Appl. No.: 13/229,434

(22) Filed: Sep. 9, 2011

(65) Prior Publication Data

US 2013/0063289 A1  Mar. 14, 2013

(51) Int. Cl.
*H03M 1/06* (2006.01)

(52) U.S. Cl.
USPC .......................................... 341/118; 341/120

(58) Field of Classification Search
USPC .................. 341/118, 120, 122, 124, 155, 156
See application file for complete search history.

(56) References Cited

U.S. PATENT DOCUMENTS

| 5,729,230 | A | 3/1998 | Jensen et al. |
| 7,319,419 | B1 * | 1/2008 | Lash et al. ..................... 341/118 |
| 7,324,028 | B2 | 1/2008 | Hsieh et al. |
| 7,405,687 | B2 | 7/2008 | Mitteregger et al. |

OTHER PUBLICATIONS

"A 4GHz CT ΔΣ ADC with 70dB DR and—74dBFS THD in 125MHz BW," ISSCC Dig. Tech. Papers, Feb. 2011, pp. 470-471 (Bolatkale, et al.).
"A 14b 20mW 640MHz CMOS CT ΔΣ ADC with 20MHz Signal Bandwidth and 12b ENOB," ISSCC Dig. Tech. Papers, Feb. 2006, pp. 62-63 (Mitteregger, et al.).
"A 0.13 μm CMOS 78dB SNDR 87mW 20MHz BW CT ΔΣ ADC with VCO-Based Integrator and Quantizer," ISSCC Dig. Tech. Papers, Feb. 2009, pp. 170-171.
"A 2.8-to-8.5mW GSM/Bluetooth/UMTS/DVB-H/WLAN Fully Reconfigurable CTΔΣ with 200kHz to 20MHz BW for 4G radios in 90nm Digital CMOS," IEEE Symposium on VLSI Circuits, 2010, pp. 153-154 (Ke, et al.).
"A 1.16mW 69dB SNR (1.2MHz BW) Continuous Time ΔΣ ADC with Immunity to Clock Jitter," IEEE Custom Integrated Circuits Conference, Sep. 2010 (Balachandran, et al.).
"Sigma-Delta Modulator With Spectrally Shaped Feedback," IEEE Transactions on Circuits and Systems II, vol. 50, No. 9, Sep. 2003, pp. 518-530 (Omid Oliaei).
"Compensating for Quantizer Delay in Excess of One Clock Cycle in Continuous-Time ΔΣ Modulators," IEEE Transactions on Circuits and Systems II, vol. 57, Issue 9, Sep. 2010, pp. 676-680 (Singh, et al.).

* cited by examiner

*Primary Examiner* — Joseph Lauture
(74) *Attorney, Agent, or Firm* — Alan A. R. Coopoer; W. James Brady; Frederick J. Telecky, Jr.

(57) ABSTRACT

In higher order sigma-delta modulators (SDMs), there are oftentimes errors introduced by the digital-to-analog (DAC) switches. Namely, parasitic capacitances associated with switches can introduce second harmonic spurs. Here, however, compensation circuits and buffers are provided. The buffers bias the switches in saturation, and the compensation circuits provide a "ground boost" for the buffers. The combination of the buffer and compensation circuit reduces the second harmonic spur, while also improving the Signal-to-Noise Ratio (SNR) and Signal-to-Noise-plus-Distortion Ratio (SNDR).

14 Claims, 4 Drawing Sheets

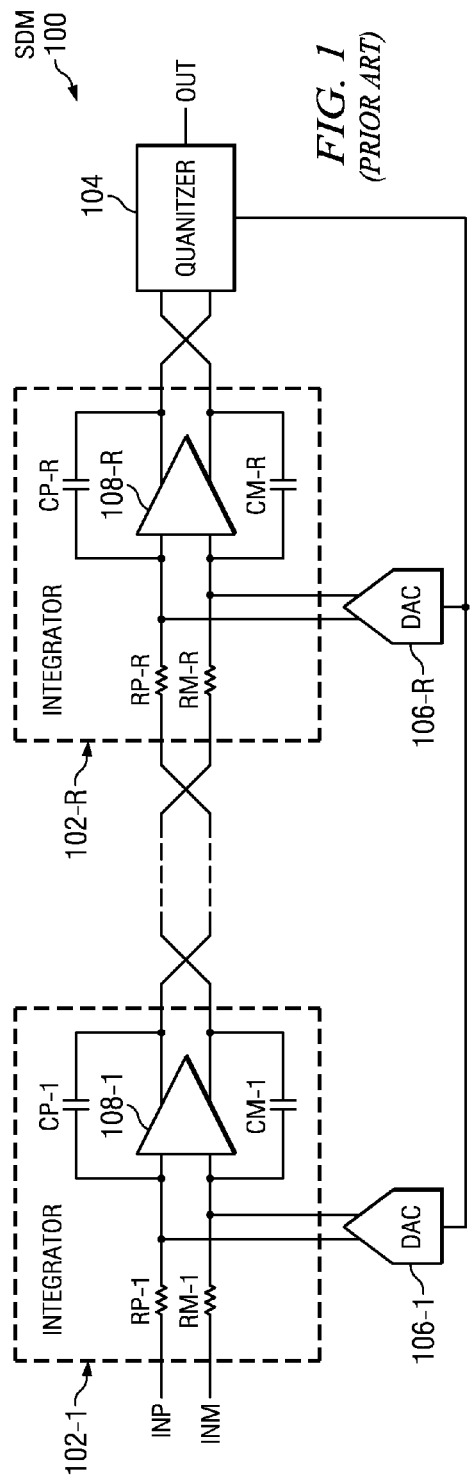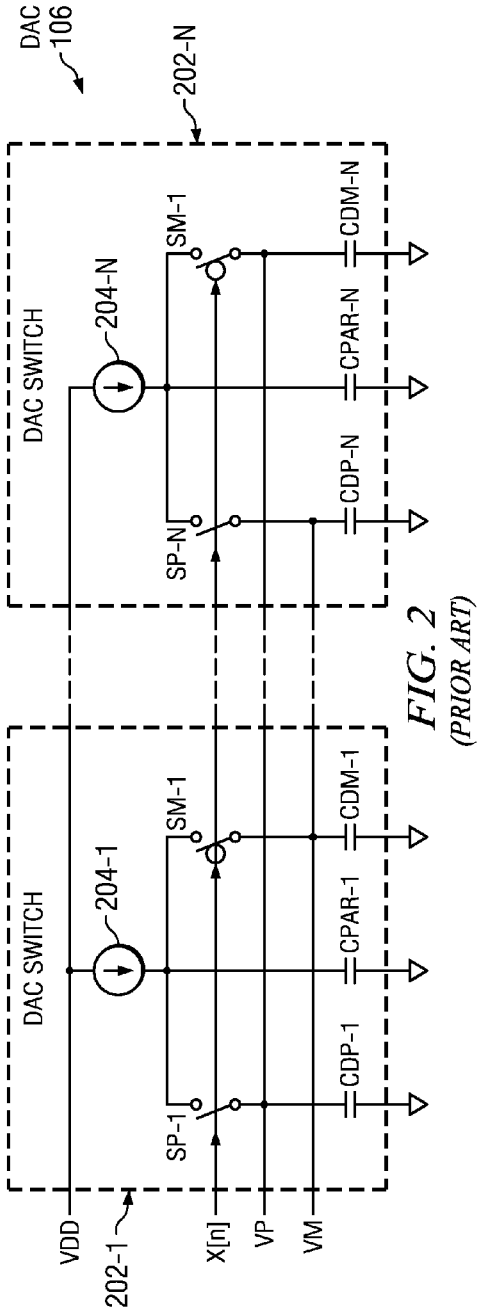
*FIG. 1*
*(PRIOR ART)*
*FIG. 2*
*(PRIOR ART)*

CORRECTING FOR NON-LINEARITIES IN A CONTINUOUS-TIME SIGMA-DELTA MODULATOR

TECHNICAL FIELD

The invention relates generally to a sigma-delta modulator (SDM) and, more particularly, to correcting for non-linearities in an SDM.

BACKGROUND

Turning to FIG. 1, an example of a conventional $R^{th}$-order SDM 100 can be seen. This SDM 100 generally comprises integrators 102-1 to 102-R coupled in series with one another, a quantizer 104 (which generally includes a latched comparator and a D flip-flop) that is coupled to integrator 102-R, and digital-to-analog converters (DACs) 106-1 to 106-R (which are respectively associated and coupled to integrators 102-1 to 102-R). As shown, SDM 100 generates digital output signals OUT from a differential input signal INP and INM; consequently, integrators 102-1 to 102-R each have a positive path (which respectively includes resistors RP-1 to RP-R and capacitors CP-1 to CP-R) and a negative path (which respectively includes resistors RM-1 to RM-R and capacitors CM-1 to CM-R) that are respectively coupled to amplifiers 108-1 to 108-R. The DACs 106-1 to 106-R (which are current steering DACs) then provide adjustments (i.e., currents) to the positive and negative paths of integrators 102-1 to 102-R (respectively) based on an output of a comparator within the quantizer 104.

Each DAC 106-1 (hereinafter 106) generally comprises several DAC switches 202-1 to 202-N (which can be seen in FIG. 2). Each of these DAC switches 202-1 to 202-N provides a predetermined current (from its current source 204-1 to 204-N) to its positive and negative paths (hereinafter VP and VM, respectively). The directions of these predetermined currents are based on the configuration of switches SP-1 to SP-N and SM-1 to SM-N (which are controlled by the control signal X[n]). A problem with this arrangement is that there is both an imbalance between switch pairs SP-1/SM-1 to SP-N/SM-N in DAC switches 202-1 to 202-N due to offsets and a parasitic capacitances CPAR-1 to CPAR-N that results in a large spur at the second harmonic (as shown in FIG. 3). Therefore, there is a need for an improved SDM.

Some examples of conventional circuits are: U.S. Pat. No. 5,729,230; U.S. Pat. No. 7,324,028; U.S. Pat. No. 7,405,687; Bolatkale et. al., "A 4 GHz CT ΔΣ ADC with 70 dB DR and −74 dBFS THD in 125 MHz BW," *ISSCC Dig. Tech. Papers*, pp. 470-471, February 2011; Mitteregger et. al., "A 14b 20 mW 640 MHz CMOS CT ΣΔ ADC with 20 MHz Signal Bandwidth and 12b ENOB," *ISSCC Dig. Tech. Papers*, pp. 62-63, February 2006; Park et al., "A 0.13 μm CMOS 78 dB SNDR 87 mW 20 MHz BW CT ΔΣ ADC with VCO-based Integrator and Quantizer," *ISSCC Dig. Tech. Papers*, pp. 170-171, February 2009; Ke et al., "A 2.8-to-8.5 mW GSM/Blue-Tooth/UMTS/DVB-H/WLAN Fully Reconfigurable CT ΔΣ with 200 KHz to 20 MHz BW for 4G radios in 90 nm digital CMOS," *IEEE Symposium on VLSI Circuits*, pp. 153-154, 2010; Balachandran et. al., "A 1.16 mW 69 dB SNR (1.2 MHz BW) Continuous-Time ΣΔ ADC with Immunity to Clock Jitter," *IEEE Custom Integrated Circuits Conference*, September 2010; Oliaei, "Sigma-Delta Modulators with Spectrally Shaped Feed-Back," *IEEE Transactions on Circuits and Systems II*, Vol. 50, No. 9, pp. 518-530, September 2003; and Singh et al., "Compensating for Quantizer Delay in Excess of One Clock Cycle in Continuous Time Delta Sigma Modulators," *IEEE Transactions on Circuits and Systems II*, Vol. 57, Issue 9, pp. 676-680, September 2010.

SUMMARY

The present invention, accordingly, provides an apparatus. The apparatus comprises a first path that is adapted to carry a first portion of a differential input signal; a second path that is adapted to carry a second portion of the differential input signal; a digital-to-analog converter (DAC) having a plurality of DAC switches, wherein each DAC switch includes: a current source; a first switch that is coupled between the current source and the first path; a second switch that is coupled between the current source and the second path; a first buffer that receives a control signal and that controls the first switch; a second buffer that receives an inverse of the control signal and that controls the second switch; a first compensation circuit that is coupled to the first buffer; and a second compensation circuit that is coupled to the second buffer, wherein the first and second compensation circuits compensate for an offset between the first and second switches.

In accordance with the present invention, the first buffer having a first power terminal and a second power terminal, and wherein the second buffer having a first power terminal and a second power terminal, and wherein the first compensation circuit that is coupled to at least one of the first and second power terminals of the first buffer, and wherein the second compensation circuit that is coupled to at least one of the first and second power terminals of the second buffer.

In accordance with the present invention, the first compensation circuit is coupled to the second power terminal of the first buffer, and wherein the second compensation circuit is coupled to the second power terminal of the second buffer, and wherein the apparatus further comprises: a first voltage rail that is coupled to the current source and the first power terminals of the first and second buffers; and a second voltage rail that is coupled to the first and second compensation circuits.

In accordance with the present invention, the current source further comprises a first current source, and wherein the first compensation circuit further comprises: a second current source that is coupled to the first voltage rail and the second power terminal of the first buffer, wherein the second current source is programmable; and a resistor-capacitor (RC) network that is coupled to the second current source.

In accordance with the present invention, the RC network further comprises a first RC network, and wherein the second compensation circuit further comprises: a third current source that is coupled to the first voltage rail and the second power terminal of second buffer, wherein the third current source is programmable; and a second RC network that is coupled to the third current source.

In accordance with the present invention, each of the first and second RC networks further comprises: a resistor that is coupled to the second voltage rail; and a capacitor that is coupled to the second voltage rail.

In accordance with the present invention, an apparatus is provided. The apparatus comprises an integrator having a first input path and a second input path, wherein the integrator is adapted to receive a differential input signal on the first and second input paths; a quantizer that is coupled to the integrator; and a DAC that is coupled to the integrator and that receives a control signal from the quantizer, wherein the DAC has a plurality of DAC switches, wherein each DAC switch includes: a current source; a first switch that is coupled between the current source and the first input path; a second switch that is coupled between the current source and the second input path; a first buffer that receives the control signal and that controls the first switch; a second buffer that receives an inverse of the control signal and that controls the second switch; a first compensation circuit that is coupled to the first buffer; and a second compensation circuit that is coupled to the second buffer, wherein the first and second compensation circuits compensate for an offset between the first and second switches.

In accordance with the present invention, the integrator further comprises a plurality of integrators coupled in series with one another, and wherein the DAC further comprise a plurality of DACs, and wherein each DAC is coupled to at least one of the integrators.

In accordance with the present invention, the quantizer further comprises a comparator, and wherein the control signal is an output of the comparator.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is an example of a conventional $R^{th}$-order SDM;
FIG. 2 is an example of a DAC of FIG. 1.

DETAILED DESCRIPTION

Figure 3:
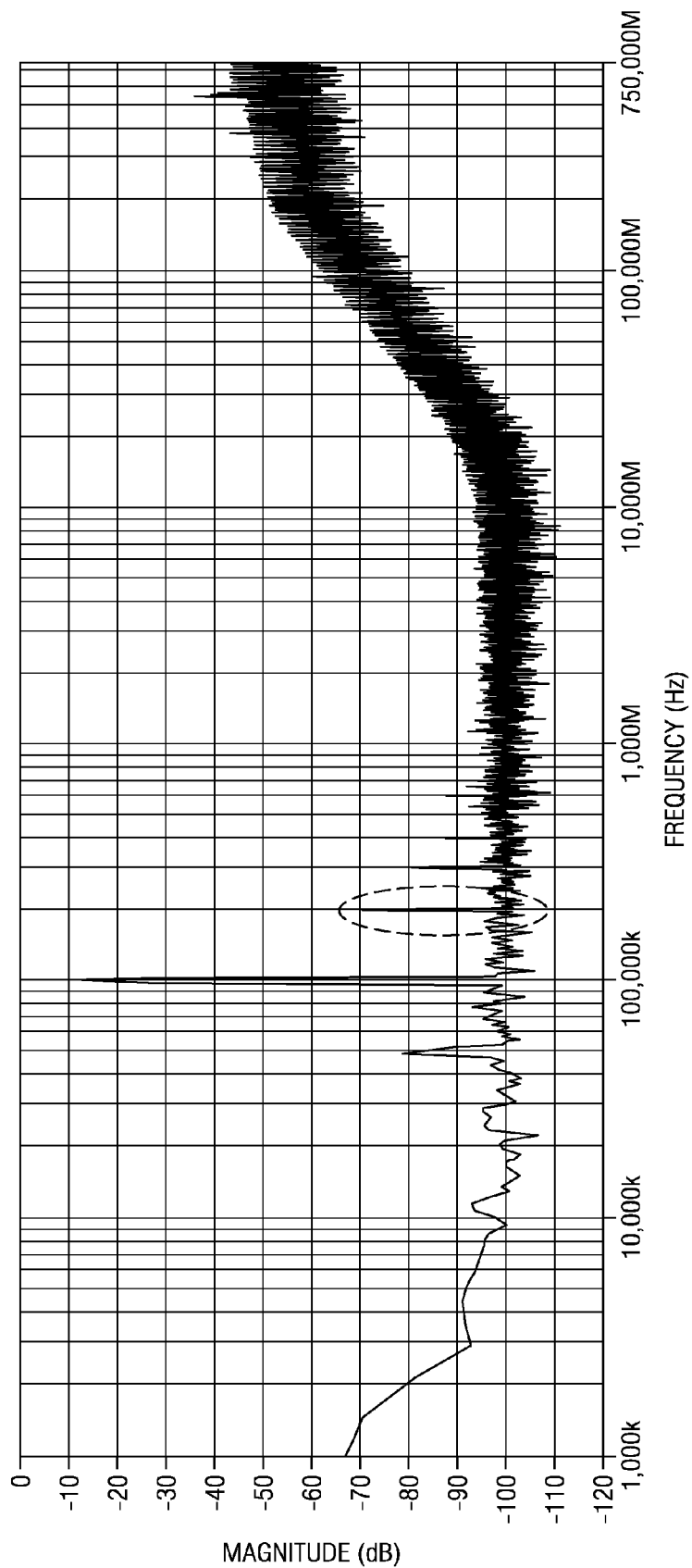
FIG. 3 is an illustration of the performance of the SDM of FIG. 1.

Refer now to the drawings wherein depicted elements are, for the sake of clarity, not necessarily shown to scale and wherein like or similar elements are designated by the same reference numeral through the several views.

Turning back to FIGS. 1 and 2, the non-linearities of the SDM can be modeled examining the effect of parasitics within DACs 106-1 to 106-3. To perform this analysis, the focus can be limited to one DAC switch (i.e., 202-1) of the first DAC 106-1. Bering this in mind, the feedback current $I_{FB}$ flowing into the input terminals of amplifier 108-1 (summing junction) is:

$$I_{FB} = I_{202-1} \cdot X[n], \quad (1)$$

where X[n] is the output of the comparator within quantizer 104 (which includes both signal and quantization noise). Assuming that this summing junction has sufficiently low impedance and assuming that the resistance of resistors RP-1 and RM-1 is about the same (or value $R_1$), then the signal current $I_{SIGNAL}$ is:

$$I_{SIGNAL} = \frac{V_{IN}}{R_1}, \quad (2)$$

where $V_{IN}$ is the difference between the portions of the differential input signal INP and INM. The resulting error current $I_{ERROR}$ should then be:

$$I_{ERROR} = I_{SIGNAL} - I_{FB} = \frac{V_{IN}}{R_1} - I_{202-1} \cdot X[n], \quad (3)$$

Ideally, this error current $I_{ERROR}$ should include quantization noise (and a small amount of signal content). However, switches SP-1 and SM-1 have a parasitic capacitance that introduces a non-ideality, and, if it is assumed that the comparator within quantizer 104 is a 1-bit comparator, transitions for a non-return-to-zero (NRZ) feedback scheme can be examined to determine the effect of this parasitic capacitance, but this can be equally applicable to a return-to-zero (RZ) feedback scheme.

Look first to a transition from −1 (for X[n−1]) to +1 (for X[n]), the parasitic capacitor CPAR-1 (having a capacitance of Cp) for switches SP-1 and SM-1 at the time of switching is charged to the voltage on the negative input terminal of amplifier 108-1 at time n−1 (or Vm[n−1]), while capacitor CDP-1 (having a capacitance of $C_1$) is charged to the voltage of the positive input terminal of the amplifier 108-1 at time n−1 (or Vp[n−1]). This means, at the time of switching, the voltage on the positive input terminal of amplifier 108-1 (switching junction) would be:

$$Vp[n] = \frac{C_1 Vp[n-1] + Cp Vm[n-1]}{C_1 + Cp}. \quad (4)$$

Considering that the system can be assumed to be fully differential (i.e., Vp[n]=−Vm[n]) and that there is a reference voltage $V_{REF}$ and loop gain A, the summing junction voltage Vp[n] also is:

$$Vp[n] = -Vm[n] = \frac{X[n]V_{REF}}{2A}. \quad (5)$$

Now substituting equation (5) into equation (4), the summing junction voltage Vp[n] becomes:

$$Vp[n] = \frac{C_1 - Cp}{C_1 + Cp} Vp[n-1] = \frac{C_1 - Cp}{C_1 + Cp} \left( \frac{X[n-1]}{2A} \right) V_{REF}. \quad (6)$$

Thus, the root mean square (RMS) current $I_{C1PRMS}$ flowing into capacitor CDP-1 over one clock period T is:

$$\begin{aligned} I_{C1PRMS} &= C_1 \frac{dv}{dt} = C_1 \frac{Vp[n] - Vp[n-1]}{T} \\ &= \frac{C_1}{T} \left[ \frac{C_1 - Cp}{C_1 + Cp} \left( \frac{X[n-1]}{2A} \right) V_{REF} - \frac{X[n-1]}{2A} V_{REF} \right] \\ &= \frac{C_1}{T} \left[ \frac{C_1 - Cp}{C_1 + Cp} - 1 \right] \frac{X[n-1]}{2A} V_{REF} \end{aligned} \quad (7)$$

-continued $$= \frac{C_1}{T}\left[\frac{-2Cp}{C_1+Cp}\right]\frac{X[n-1]}{2A}V_{REF}$$

$$\approx -\frac{2Cp}{T}\frac{X[n-1]}{2A}V_{REF}$$

This results in the total differential current $I_{PDIFF}$ flowing into the summing junction for a −1 to +1 transition is then:

$$I_{PDIFF} = I_{202-1} + I_{C1PRMS} = I_{202-1} - \frac{2Cp}{T}\frac{X[n-1]}{2A}V_{REF} \quad (8)$$

Looking now to a transition from +1 (for X[n−1]) to −1 (for X[n]), a similar analysis (as above) can be performed relating to the negative input terminal of the amplifier. The resulting total differential current $I_{MDIFF}$ flowing into the summing junction for a +1 to −1 transition is:

$$I_{MDIFF} = -I_{202-1} + I_{C1MRMS} = -I_{202-1} - \frac{2Cp}{T}\frac{X[n-1]}{2A}V_{REF} \quad (9)$$

Additionally, for transitions from +1 to +1 and −1 to −1, the total differential currents $I_{PTDIFF}$, $I_{MTDIFF}$ (respectively) are:

$$I_{PTDIFF} = I_{202-1} \quad (10)$$

$$I_{MTDIFF} = -I_{202-1} \quad (11)$$

Thus, from equations (8) through (11), a generalized expression for the total differential current $I_{DIFF1}$ is:

$$I_{DIFF1} = \left[I_{202-1} - \left(\frac{2Cp}{T}\frac{X[n-1]}{2A}V_{REF}\right)\left(\frac{X[n]-X[n-1]}{2}\right)\right]\cdot X[n] \quad (12)$$

In addition to the above non-ideality, the presence of offset voltages in the amplifier/transconductance module can create additional non-idealities in the presence of the parasitic capacitance. Making the same assumptions detailed above and for a transition from −1 (for X[n−1]) to +1 (for X[n]), the parasitic capacitor Cp for switches SP-1 and SM-1 at the time of switching and capacitor CDP-1 are charged one half of the offset voltage VOS or, respectively, voltages −VOS/2 and VOS/2. This results in the RMS current $I_{CPPRMS}$ flowing into the parasitic capacitor CPAR-1 over one clock period T and total differential current $I_{PPDIFF}$ are:

$$I_{CPPRMS} = Cp\frac{dv}{dt} = -Cp\frac{VOS}{T} \quad (13)$$

$$I_{PPDIFF} = I_{202-1} + I_{CPPRMS} = I_{202-1} - Cp\frac{VOS}{T} \quad (14)$$

Similarly, the total differential current $I_{MPDIFF}$, $I_{PTPDIFF}$, and $I_{MTPDIFF}$ (respectively) are as follows:

$$I_{MPDIFF} = -I_{202-1} - Cp\frac{VOS}{T} \quad (15)$$

$$I_{PTPDIFF} = I_{202-1} \quad (16)$$

$$I_{MTPDIFF} = -I_{202-1}, \quad (17)$$

yielding the generalized expression for the impact due to the offset voltage VOS:

$$I_{DIFF2} = \left[I_{202-1} - \left(\frac{CpVOS}{T}\right)\left(\frac{X[n]-X[n-1]}{2}\right)\right]\cdot X[n] \quad (18)$$

Now, combining equations (12) and (18), the total generalized expression (total current $I_{TDIFF}$) due to the parasitic capacitance and offset is:

$$I_{TDIFF} = \quad (19)$$

$$\left[I_{202-1} - \left(\frac{CpVOS}{T} + \frac{2Cp}{T}\frac{X[n-1]}{2A}V_{REF}\right)\left(\frac{X[n]-X[n-1]}{2}\right)\right]\cdot X[n],$$

which means that the second harmonic $I_{ER2d}$ for the error current is:

$$I_{ER2d} = \left[\left(\frac{-CpVOS}{T}\right)\left(\frac{X[n-1]}{2}\right)\right]\cdot X[n], \quad (20)$$

From equation (20) above, there are several implications. There is an error that is proportion to the parasitic capacitance, and this error increases with frequency. To counteract these effects, switches SP-1 and SM-1 can be biased in saturation.

However, switches SP-1 and SM-1 are typically not perfectly matched; there is usually a mismatch between switches SP-1 and SM-1, which can introduce other errors. If one were to assume that switches SP-1 and SM-1 are PMOS switches that are in saturation when activated, then the drain current $I_D$ is:

$$I_D = I_{202-1} = \frac{\mu CW}{2L}(V_S - V_G - V_T)^2, \quad (21)$$

yielding a source voltage $V_S$ of:

$$V_S = \sqrt{\frac{2I_{202-1}}{\mu C\left(\frac{W}{L}\right)}} + V_G + V_T, \quad (22)$$

This means that if the PMOS transistors being employed as switches SP-1 and SM-1 are the same except for their threshold voltages (which are voltages $V_{T1}$ and $V_{T2}$, respectively), then the difference in source voltages is approximately equal to the difference in threshold voltages ($\Delta V_T = V_{T1} - V_{T2}$). Thus, for the transitions (as described above) of −1 for X[n−1] to +1 for X[n], +1 for X[n−1] to −1 for X[n], +1 for X[n−1] to +1 for X[n], and −1 for X[n−1] to −1 for X[n], the differential currents, respectively, are:

$$I_{DIFF1} = I_{202-1} - I_{ERRORM} = I_{202-1} - \frac{Cp\Delta V_T}{T} \quad (23)$$

-continued $$I_{DIFF2} = -I_{202-1} - I_{ERRORM} = -I_{202-1} - \frac{Cp\Delta V_T}{T} \quad (24)$$

$$I_{DIFF3} = I_{202-1} \quad (25)$$

$$I_{DIFF4} = -I_{202-1} \quad (26)$$

resulting in the generalized expression:

$$I_{DIFFT} = \left[I_{202-1} - \frac{Cp\Delta V_T}{T} \frac{X[n] - X[n-1]}{2}\right] X[n] \quad (27)$$

While this error may appear to be problematic, it can be observed that the error current $I_{ERRORM}$ (which generally introduces second order harmonic errors with noise folding) can reduce the magnitude of the feedback current $I_{FB}$ of equation (1). Thus, mismatch compensation can be used to compensate for the second order harmonic errors introduced by the parasitic capacitances.

Figure 4:
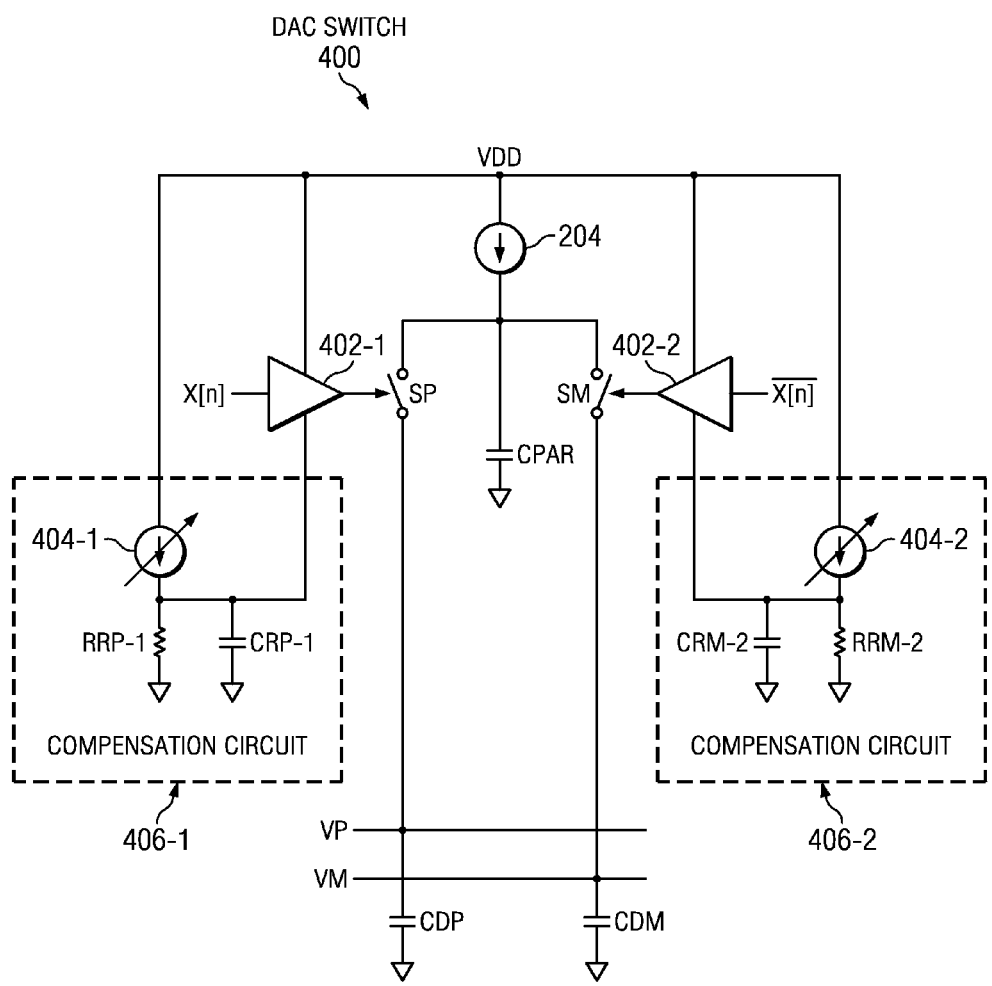
FIG. 4 is an example of a DAC switch in accordance with the present invention.

Turning to FIG. 4, an improved DAC switch 400 (which can replace DAC switches 202-1 to 202-N in SDM 100) can be seen. This DAC switch 400 includes the same components as DAC switch 106 of FIG. 2 (which are hereinafter labeled current source 204, switches SP and SM, and capacitors CPAR, CDP, and CDM) as well as buffers 402-1 and 402-2 and compensation circuits 406-1 and 406-2. Buffers 402-1 and 402-2 receive the control signal X[n] and its inverse, respectively, and control switches SP and SM based on the control signal X[n] and its inverse. Typically, buffers 402-1 and 402-2 bias switches in saturation, and the compensation circuits 406-1 and 406-2 provide compensation for the offset between switches SP and SM. This is, for example, accomplished by use of a "ground boost" with current sources 404-1 and 404-2 and the resistor-capacitor (RC) networks (i.e., resistors RRP-1 and RRP-2 and capacitors CRP-1 and CRP-2). The current sources 404-1 and 404-2 are programmable so as to be modified or calibrated such that the appropriate "ground boost" can be provided. Additionally, as an alternative, compensation circuits 406-1 and 406-2 can be modified so as to be coupled to the positive power terminals of buffers 402-1 and 402-2 to provide substantially the same benefit.

Figure 5:
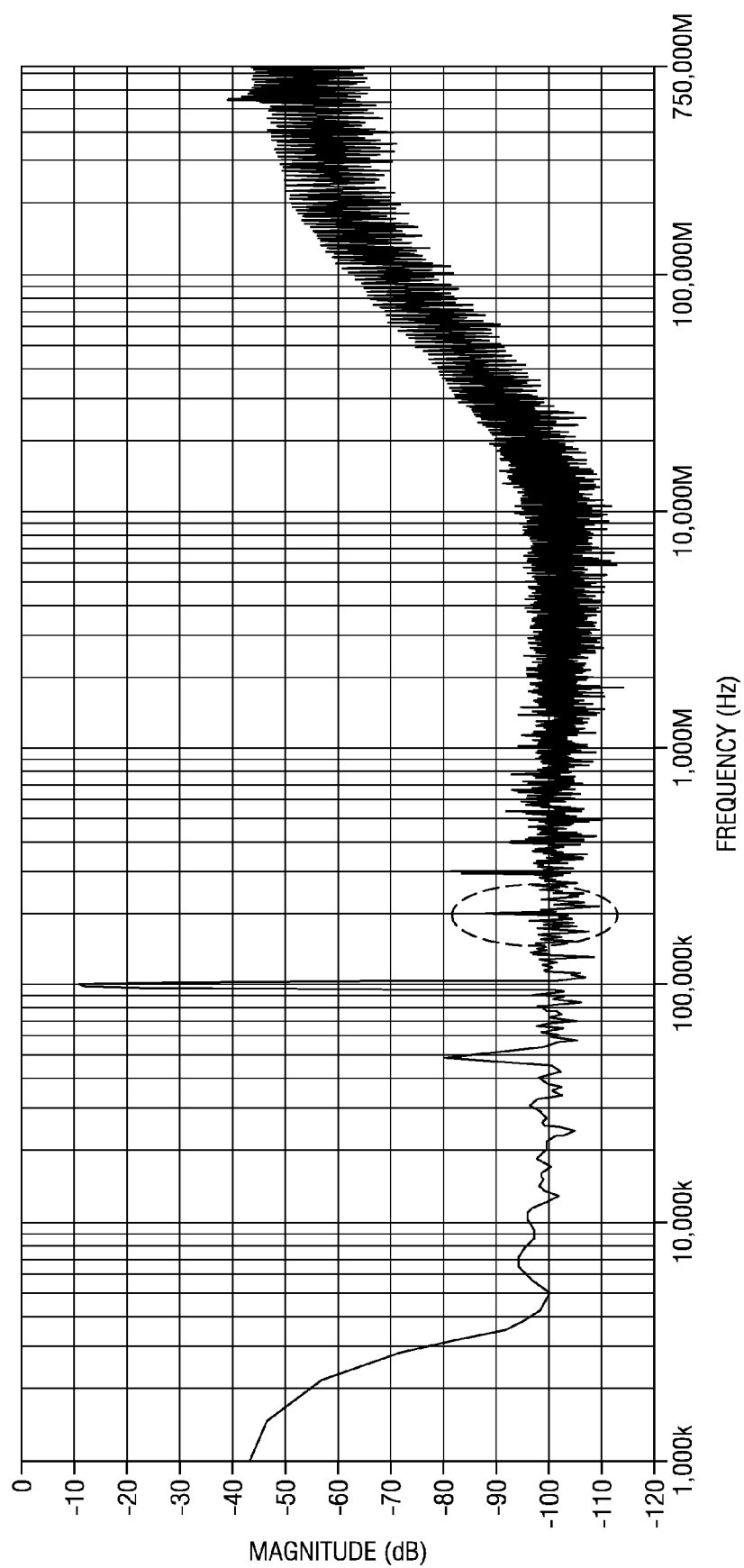
FIG. 5 is an illustration of the performance of the SDM of FIG. 1 using the DAC switch of FIG. 4.

By using DAC switches 400 with SDM 100, the performance can be improved. As shown in FIG. 5, the second harmonic spur is reduced (as compared with FIG. 3). In particular and for example, there is an approximate 15 dB improvement in the spur, an improvement in Signal-to-Noise Ratio (SNR) of 51.8 dB to 52.8 dB, and an improvement in the Signal-to-Noise-plus-Distortion Ratio (SNDR) of 50.97 to 52 between FIGS. 3 and 5. This DAC switch 400 can be included in some or all of the DACs within an SDM (i.e., SDM 100). For example, DAC switch 400 can be implemented in one DAC (where reasonable accuracy can be obtained, such as a configuration where the DACs are implemented in a finite impulse response fashion).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a first path that is adapted to carry a first portion of a differential input signal;
    a second path that is adapted to carry a second portion of the differential input signal;
    a digital-to-analog converter (DAC) having at least one DAC switch, wherein each DAC switch includes:
        a current source;
        a first switch that is coupled between the current source and the first path;
        a second switch that is coupled between the current source and the second path;
        a first buffer that receives a control signal and that controls the first switch;
        a second buffer that receives an inverse of the control signal and that controls the second switch;
        a first compensation circuit that is coupled to the first buffer; and
        a second compensation circuit that is coupled to the second buffer, wherein the first and second compensation circuits compensate for an offset between the first and second switches.

2. The apparatus of claim 1, wherein the first buffer having a first power terminal and a second power terminal, and wherein the second buffer having a first power terminal and a second power terminal, and wherein the first compensation circuit that is coupled to at least one of the first and second power terminals of the first buffer, and wherein the second compensation circuit that is coupled to at least one of the first and second power terminals of the second buffer.

3. The apparatus of claim 2, wherein the first compensation circuit is coupled to the second power terminal of the first buffer, and wherein the second compensation circuit is coupled to the second power terminal of the second buffer, and wherein the apparatus further comprises:
    a first voltage rail that is coupled to the current source and the first power terminals of the first and second buffers; and
    a second voltage rail that is coupled to the first and second compensation circuits.

4. The apparatus of claim 3, wherein the current source further comprises a first current source, and wherein the first compensation circuit further comprises:
    a second current source that is coupled to the first voltage rail and the second power terminal of the first buffer, wherein the second current source is programmable; and
    a resistor-capacitor (RC) network that is coupled to the second current source.

5. The apparatus of claim 4, wherein the RC network further comprises a first RC network, and wherein the second compensation circuit further comprises:
    a third current source that is coupled to the first voltage rail and the second power terminal of second buffer, wherein the third current source is programmable; and
    a second RC network that is coupled to the third current source.

6. The apparatus of claim 5, wherein each of the first and second RC networks further comprises:
    a resistor that is coupled to the second voltage rail; and
    a capacitor that is coupled to the second voltage rail.

7. An apparatus comprising:
    an integrator having a first input path and a second input path, wherein the integrator is adapted to receive a differential input signal on the first and second input paths;

a DAC that is coupled to the integrator and that receives a control signal, wherein the DAC has at least one DAC switch, wherein each DAC switch includes:
   a current source;
   a first switch that is coupled between the current source and the first input path;
   a second switch that is coupled between the current source and the second input path;
   a first buffer that receives the control signal and that controls the first switch;
   a second buffer that receives an inverse of the control signal and that controls the second switch;
   a first compensation circuit that is coupled to the first buffer; and
   a second compensation circuit that is coupled to the second buffer, wherein the first and second compensation circuits compensate for an offset between the first and second switches.

8. The apparatus of claim 7, wherein the first buffer having a first power terminal and a second power terminal, and wherein the second buffer having a first power terminal and a second power terminal, and wherein the first compensation circuit that is coupled to at least one of the first and second power terminals of the first buffer, and wherein the second compensation circuit that is coupled to at least one of the first and second power terminals of the second buffer.

9. The apparatus of claim 8, wherein the first compensation circuit is coupled to the second power terminal of the first buffer, and wherein the second compensation circuit is coupled to the second power terminal of the second buffer, and wherein the apparatus further comprises:
   a first voltage rail that is coupled to the current source and the first power terminals of the first and second buffers; and
   a second voltage rail that is coupled to the first and second compensation circuits.

10. The apparatus of claim 9, wherein the current source further comprises a first current source, and wherein the first compensation circuit further comprises:
   a second current source that is coupled to the first voltage rail and the second power terminal of the first buffer, wherein the second current source is programmable; and
   an RC network that is coupled to the second current source.

11. The apparatus of claim 10, wherein the RC network further comprises a first RC network, and wherein the second compensation circuit further comprises:
   a third current source that is coupled to the first voltage rail and the second power terminal of second buffer, wherein the third current source is programmable; and
   a second RC network that is coupled to the third current source.

12. The apparatus of claim 11, wherein each of the first and second RC networks further comprises:
   a resistor that is coupled to the second voltage rail; and
   a capacitor that is coupled to the second voltage rail.

13. The apparatus of claim 12, wherein the integrator further comprises a plurality of integrators coupled in series with one another, and wherein the DAC further comprise a plurality of DACs, and wherein each DAC is coupled to at least one of the integrators.

14. The apparatus of claim 12, wherein the quantizer further comprises a comparator, and wherein the control signal is an output of the comparator.

* * * * *